(12) United States Patent
Van Der Vleuten

(10) Patent No.: US 6,385,588 B2
(45) Date of Patent: *May 7, 2002

(54) DATA COMPRESSION AND EXPANSION OF AN N-LEVEL INFORMATION SIGNAL

(75) Inventor: Renatus J. Van Der Vleuten, Eindhoven (NL)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/089,628

(22) Filed: Jun. 2, 1998

(30) Foreign Application Priority Data

Jun. 4, 1997 (EP) .............................. 97201680
Jul. 11, 1997 (EP) .............................. 97202137
Oct. 9, 1997 (EP) .............................. 97203144

(51) Int. Cl.$^7$ ..................... H03M 5/02; H03M 7/40; G10L 21/04
(52) U.S. Cl. ..................... 704/504; 341/56; 341/94; 341/107
(58) Field of Search ............................... 704/219, 230, 704/500, 503, 504; 341/58, 65, 107, 143, 56, 94

(56) References Cited

U.S. PATENT DOCUMENTS

| | | | |
|---|---|---|---|
| 3,973,081 A | * 8/1976 | Hutchins | .................... 704/230 |
| 4,749,983 A | 6/1988 | Langdon, Jr. | |
| 4,928,288 A | 5/1990 | D'Aria et al. | |
| 5,274,375 A | * 12/1993 | Thompson | .................... 341/143 |
| 5,671,236 A | * 9/1997 | Denissen et al. | .............. 341/58 |
| 5,835,034 A | * 11/1998 | Seroussi et al. | .............. 341/65 |
| 5,884,269 A | * 3/1999 | Cellier et al. | ................ 704/501 |
| 6,041,302 A | * 3/2000 | Bruekers | ..................... 704/503 |
| 6,229,463 B1 | * 5/2001 | Van Der Vleuten et al. | ..... 341/107 |

* cited by examiner

Primary Examiner—William Korzuch
Assistant Examiner—Martin Lerner
(74) Attorney, Agent, or Firm—Michael E. Belk

(57) ABSTRACT

A data compression apparatus for data compressing an information signal, which is in n-level form, n being larger than 2. The data compression apparatus includes an input terminal for receiving the n-level information signal, an entropy coder, such as an arithmetic coder having an input for receiving an input signal, which is adapted to carry out a lossless encoding step on the input signal, so as to obtain a data compressed output signal at an output. The apparatus further includes a prediction filter for carrying out a prediction step on the n-level information signal so as to obtain a prediction signal and a probability signal determining unit for generating the probability signal in response to the prediction signal. An output terminal is available for supplying the data compressed output signal. Further, a data expansion apparatus is disclosed.

38 Claims, 2 Drawing Sheets

DATA COMPRESSION AND EXPANSION OF AN N-LEVEL INFORMATION SIGNAL

BACKGROUND OF THE INVENTION

1. Field of the Invention

The invention relates to a data compression apparatus for data compressing an n-level information signal, to a data compression method, a transmitter comprising the data compression apparatus, a record carrier having the data compressed audio signal recorded on it in a track of said record carrier, to a data expansion apparatus for data expanding a data compressed n-level information signal, to a data expansion method, and to a receiver comprising the data expansion apparatus.

2. Description of the Related Art

Oversampling delta-sigma data converters are used for high-quality analog-to-digital conversion. Usually, these converters are designed such as to produce a binary, two level digital output signal, also referred to as bitstream or DSD signal. Although it is also possible to design delta-sigma data converters that produce output signals with more than two levels, such converters have not been used in practice because of distortion products and noise caused by non-linearities in such multi-level converters.

Recently, however, a converter has been described for generating a 3-level information signal. Reference is made in this respect to the AES preprint 4443, 'A 120 dB dynamic range, 96 kHz, stereo 24-bit analog-to-digital converter', by K. Leung et al 102nd AES convention (Munich, Germany). The 3-level information signal is available as an internal representation in the converter.

SUMMARY OF THE INVENTION

The invention aims at providing an apparatus for enabling data compression of a 3-level, more generally, an n-level information signal, and providing an apparatus for enabling data expansion of the data compressed n-level information signal so as to regain a replica of the original n-level information signal.

The data compression apparatus in accordance with the invention for data compressing an information signal, which is in n-level form, n being larger than 2, comprises input means for receiving the n-level information signal, lossless coding means having an input for receiving an input signal, for carrying out a lossless encoding step on the input signal, so as to obtain a data compressed output signal at an output, said lossless encoding means comprising an entropy encoder for carrying out the lossless encoding step on the input signal in response to a probability signal, prediction means for carrying out a prediction step on the n-level information signal so as to obtain a prediction signal, probability signal determining means for generating the probability signal in response to said prediction signal, and output means for supplying said data compressed output signal.

The data expansion apparatus in accordance with the invention for data expanding a data compressed input signal so as to obtain an information signal, which is in n-level form, n being larger than 2, comprises input means for receiving the data compressed input signal, lossless decoding means having an input for receiving the data compressed input signal, for carrying out a lossless decoding step on the data compressed input signal, so as to obtain a data expanded output signal at an output, said lossless decoding means comprising an entropy decoder for carrying out the lossless decoding step on the data compressed input signal in response to a probability signal, output means for supplying said information signal, prediction means for carrying out a prediction step on the information signal so as to obtain a prediction signal, and probability signal determining means for generating the probability signal in response to said prediction signal.

By this apparatus, a more efficient storage or transmission of an n-level information signal can be achieved.

BRIEF DESCRIPTION OF THE DRAWINGS

These and other aspects of the invention will be apparent from and elucidated further with reference to the embodiments described in the following figure description, in which.

DESCRIPTION OF THE PREFERRED EMBODIMENTS

Figure 1:
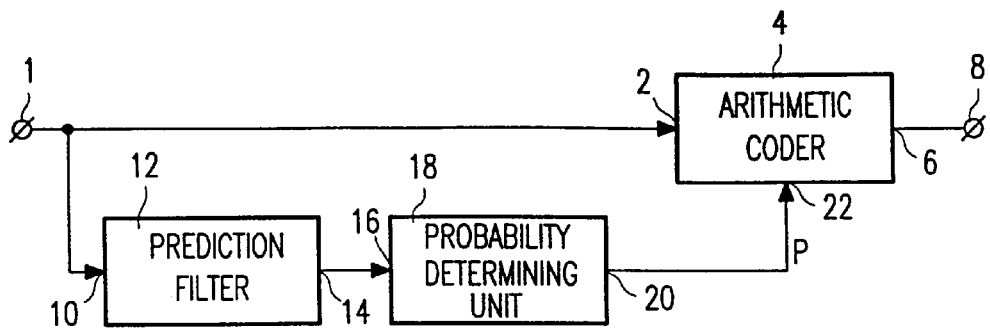
FIG. 1 shows an embodiment of the data compression apparatus.

FIG. 1 shows an embodiment of the data compression apparatus of the invention, comprising an input terminal 1 for receiving the n-level information signal. In the present example, an n-level information signal has been obtained by converting an audio signal using a delta-sigma modulator. The input terminal 1 is coupled to an input 2 of an entropy encoder which is in the present case in the form of an arithmetic coder 4. An output 6 of the arithmetic coder is coupled to an output terminal 8 of the compression apparatus.

The input terminal 1 is further coupled to an input 10 of a prediction filter, which has an output 14 coupled to an input 16 of a probability determining unit 18. The output 20 of the probability unit 18 is coupled to a control input 22 of the arithmetic coder 4.

The arithmetic coder 4 encodes the signal applied to its input 4 into a data compressed information signal in response to probability values p supplied to its control input 22 and supplies the data compressed information signal to its output 6. The probability determining unit 18 determines a probability value indicating the probability that a symbol in the n-value information signal supplied to the input terminal 1 has a predetermined level. In the case of a three valued information signal, those levels (or values) can be −1, 0 or +1. This probability value, denoted p in FIG. 1, is supplied to the arithmetic coder 4 so as to enable the data compression of the n-level information signal in the arithmetic coder 4. The determining unit 18 determines the probability values p from the output signal of the prediction filter 12. The arithmetic coder 4 can data compress the n-level information signal on a frame-by-frame basis.

The functioning of the apparatus of FIG. 1 is as follows. The prediction filter 12 realizes a prediction filtering on the n-level information so as to obtain a multi value output signal.

Various embodiments of the prediction filter unit 12 and the probability determining unit 18 are possible. In a first embodiment, the prediction filter unit 12 and the probability determining unit 18 are fixed (static) units, in the sense that their behaviour does not change in time. In a second embodiment, the filter unit 12 is adaptive, so that it can adapt itself to a changing input signal characteristic, so as to obtain the best prediction result. The probability unit 18 can again be fixed. In a third embodiment, the prediction filter unit 12 can be fixed and the probability determining unit 18 can be adaptive. This adaptivity will be explained later. In a fourth embodiment, both units 12 and 18 are adaptive.

The multi value output signal supplied by the prediction filter unit 12 can have a plurality of levels within a range of eg. +3 and −3. Further, for each of a plurality of subintervals in the value range of the multi level output signal, it is determined what the probability is that the symbol in the level in the n-level information signal is a '+1', '0' or '−1', assuming a 3-level information signal, as explained above. This could have been realized in advance, or in real time, during the data compression itself, eg. by counting the number of '+1's, '0's and '−1's occurring in the n-level information signal during a specific time interval, when the multi level output signal of the prediction filter 12 falls in one of such ranges. For each symbol supplied to the coder 4, the probability determining unit 18 supplies the three probabilities for '+1', '0' and '−1' that correspond to the subinterval in which the multi level output signal for that symbol is located. The data compressed n-level information signal is supplied by the arithmetic coder 4 to the output terminal 8, eg. for transmission via a transmission medium or a record carrier.

Figure 2:
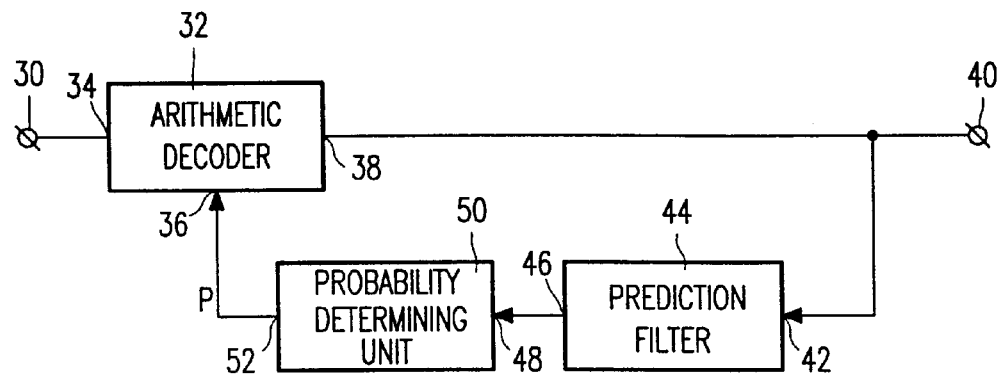
FIG. 2 shows an embodiment of a corresponding data expansion apparatus.

FIG. 2 shows a corresponding data expansion apparatus for decoding the data compressed n-level information signal, received via an input terminal 30. The data expansion apparatus of FIG. 2 comprises an entropy decoder 32, which receives the data compressed n-level information signal via an input 34. In the present example, the entropy decoder 32 is in the form of an arithmetic decoder that carries out an arithmetic decoding step on the data compressed n-level information signal, under the influence of a probability signal p, supplied to a control input 36 so as to generate a replica of the original n-level information signal which is supplied to an output 38. The output 38 of the decoder 32 is coupled to an output terminal 40 as well as to an input 42 of a prediction filter 44, which has an output 46 coupled to an input 48 of a probability determining unit 50. The probability determining unit 50 has an output 52 which is coupled to the control input 36 of the decoder 32.

The data expansion apparatus of FIG. 2 is complementary to the data compression apparatus of FIG. 1, in the sense that, if the prediction filter 12 and the unit 18 in FIG. 1 are both fixed, the prediction filter 44 and the unit 50 in FIG. 2 are also fixed, that if the prediction filter 12 is adaptive also the filter 44 is adaptive, and that if the unit 18 is adaptive, the unit 50 is also adaptive.

When the filters 12 and 44 are adaptive, it is required to transmit side information from the compression apparatus to the expansion apparatus which includes the filter coefficients. When the units 18 and 50 are adaptive, it is also required to transmit side information to the expansion apparatus, such side information comprising information concerning the conversion of the multi-level information signal supplied by the filter 44 into the probabilities p generated in response thereto by the unit 50.

The entropy encoder used in the embodiment of FIG. 1 is adapted to encode the n-level information signal using a probability signal in order to obtain the data compressed information signal, which is a binary signal. One such entropy encoder is the arithmetic coder 4 described above. One other type of such entropy coder is, as an example, the well known finite state coder. The entropy decoder used in the embodiment of FIG. 2 is adapted to decode the data compressed information signal using a probability signal in order to obtain a replica of the n-level information signal. One such entropy decoder 32 is the arithmetic decoder described above.

One other type of such entropy decoder is, as an example, the well known finite state decoder.

Figure 3:
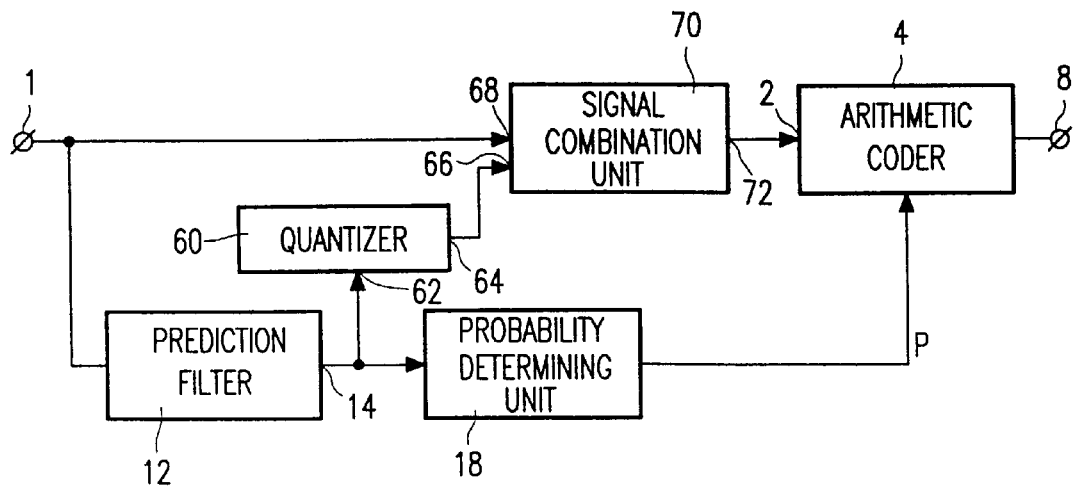
FIG. 3 shows a second embodiment of the data compression apparatus.

FIG. 3 shows another embodiment of the data compression apparatus. The data compression apparatus shows much resemblance with the data compression apparatus of FIG. 1, but further comprises a quantizer 60 having an input 62 coupled to the output 14 of the prediction filter 12 and an output 64 coupled to a first input 66 of a signal combination unit 70. The signal combination unit 70 has a second input 68 coupled to the input terminal 1 and an output 72 which is coupled to the input 2 of the arithmetic coder 4.

The functioning of the apparatus of FIG. 3 is as follows. The quantizer 60 is adapted to quantize the multi value prediction signal generated by the prediction filter 12 into an n-level output signal which is a predicted version of the n-level information signal supplied to the input 1. The signal combination unit 70 combines the n-level information signal applied to its input 68 and the predicted version therof supplied to its input 66 in a subtractive way so as to obtain a residual information signal, which is supplied to its output 72. The advantage of generating a residual information signal, is that, by combining the n-level information signal and its predicted version, the probability of occurrence of symbols with zero level in the residual information signal is significantly increased. This can simplify the subsequent data compression in the arithmetic coder 4.

The probability determining unit 18 now generates a probability value indicating the probability that a value of the residual information signal supplied by the combination unit 70 has a predetermined value, such as '+1'. This probability value, denoted p in FIG. 3, is supplied to the arithmetic coder 14 so as to enable the data compression of the n-level information signal in the arithmetic coder 14. The probability determining unit 18 determines the probability values again from the output signal of the prediction filter 12.

It should be noted that the probability values p for data compressing the residual information signal are obtained from the prediction signal generated by the prediction filter 12, which has a relation with the n-level information signal, and not from a signal that has a relation with the residual information signal. This has an advantage, in that a higher compression ratio can be obtained with the arithmetic coder 4. The arithmetic coder 4 can data compress the residual information signal on a frame-by-frame basis.

The functioning of the apparatus of FIG. 3 is as follows. As stated above, both the filter 12 and the unit 18 can be static, or one or both of the filter 12 and the unit 18 can be adaptive. The prediction filter 12 again realizes a prediction filtering on the n-level information signal so as to obtain the multi value output signal. The multi value output signal lies again within a range of eg. +3 and −3. The quantizer 60 receives the multi value output signal and generates a predicted version of the n-level information signal therefrom, eg. by allocating a value of '+1' if the multi value output signal is eg. larger than +1, by allocating a value '−1' if the multi value prediction signal is smaller than −1 and by allocating a value '0', if the multi value prediction signal lies between −1 and +1.

The residual information signal can have values '−2', '−1', '0', '+1' and '+2'. For each of a plurality of subintervals in the value range of the multi value output signal, it is determined what the probability is that the corresponding value of the residual signal is eg. '+1'. In the adaptive embodiment of the unit 18, this can be realized by counting the number of '+2's, '+1's, '0's, '−1's and '−2's occurring in the residual information signal during a specific time interval, when the multi value output signal falls in one of such ranges. The probabilities thus obtained for the various values in the multi value output signal are subsequently supplied as the probability signal p to the arithmetic coder 14. The data compressed residual information signal is supplied by the arithmetic coder 14 to the output terminal 8, for transmission via a transmission medium or for recording.

Figure 4:
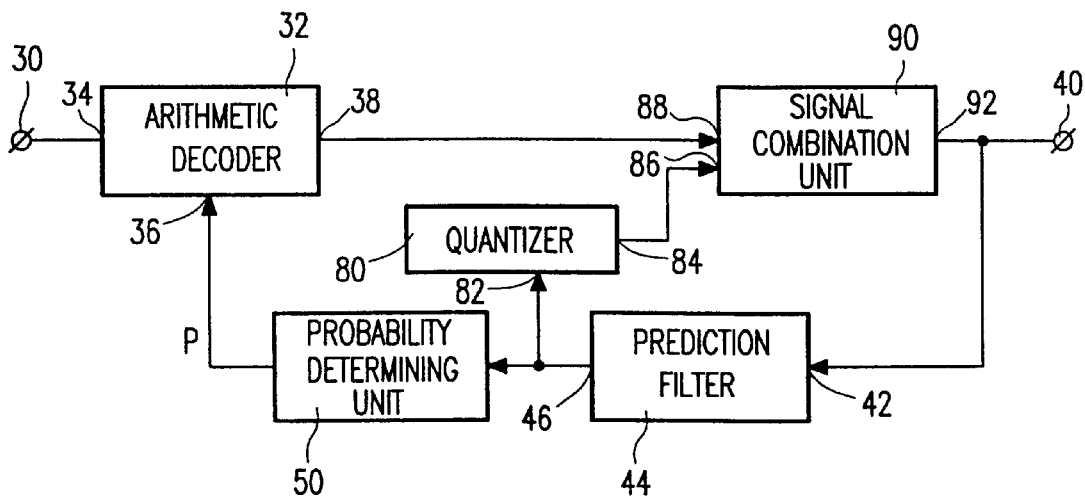
FIG. 4 shows an embodiment of the corresponding data expansion apparatus.

FIG. 4 shows a corresponding data processing apparatus for decoding the data compressed signal, received via the transmission or recording medium. The data processing apparatus of FIG. 4 shows a large resemblance with the data expansion apparatus of FIG. 2, with the difference that that apparatus of FIG. 4 further comprises a quantizer 80 and a signal combination unit 90. The quantizer has an input 82 coupled to the output 46 of the prediction filter 44, and an output 84 which is coupled to a first input 86 of the signal combination unit 90. The signal combination unit 90 has a second input 88 which is coupled to the output 38 of the decoder 32. The output 92 of the signal combination unit 92 is coupled to the output terminal 40 and to the input 42 of the prediction filter.

The decoder 32 receives the data compressed residual information signal via its input 34. The decoder 32 carries out an arithmetic decoding step on the data compressed residual information signal under the influence of the probability signal p, supplied to the control input 36 so as to generate a replica of original residual information signal which is supplied to its output 38. The replica is supplied to the input 88 of the signal combination unit 90. The signal combination unit 90 further receives a predicted version of the n-level information signal via its input 86 and generates a replica of the original n-level information signal at its output 92 in response thereto.

The functioning of the prediction filter 44 and the quantizes, 80 can be identical to the functioning of the prediction filter 12 and the quantizer 60 in FIG. 3. When the filters 12 and 44 are adaptive, side information will be transmitted concerning the filter coefficients in the filter 44. When the units 18 and 50 are adaptive, the side information will also include information concerning the conversion of the multi value output signal into the probabilities p.

The entropy encoder used in the embodiment of FIG. 3 is adapted to encode the residual information signal using a probability signal in order to obtain the data compressed residual information signal. One of such entropy encoder is the arithmetic coder 4 described above. One other type of such entropy coder is, as an example, the well known finite state coder. The entropy decoder used in the embodiment of FIG. 4 is adapted to decode the data compressed residual information signal using a probability signal in order to obtain a replica of the residual information signal. One of such entropy decoder 32 is the arithmetic decoder described above. One other type of such entropy decoder is, as an example, the well known finite state decoder.

Figure 5:
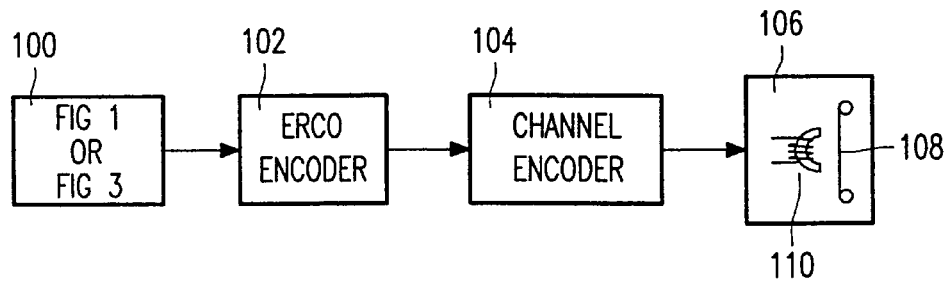
FIG. 5 shows a data compression apparatus incorporated in a transmitter, which is in the form of as a recording apparatus.

FIG. 5 shows an embodiment of a transmission apparatus which is in the form of a recording apparatus. The recording apparatus comprises in block 100 the data compression apparatus shown in FIG. 1 or 3. The recording apparatus further comprises a write unit 106 for writing the data compressed n-level information signal in a track on the record carrier 108. In the present example, the record carrier 108 is a magnetic record carrier, so that the write unit 106 comprises at least one magnetic head 110 for writing the data compressed n-level information signal in the record carrier 108. The record carrier may however be an optical record carrier, such as a CD disk or a DVD disk.

Transmission via a transmission medium, such as a radio frequency link or a record carrier, generally requires an error correction encoding and a channel encoding carried out on the data compressed information signal to be transmitted. FIG. 5 shows such signal processing steps. The recording arrangement of FIG. 5 therefore comprises an error correction encoder 102, well known in the art, and a channel encoder 104, also well known in the art.

Figure 6:
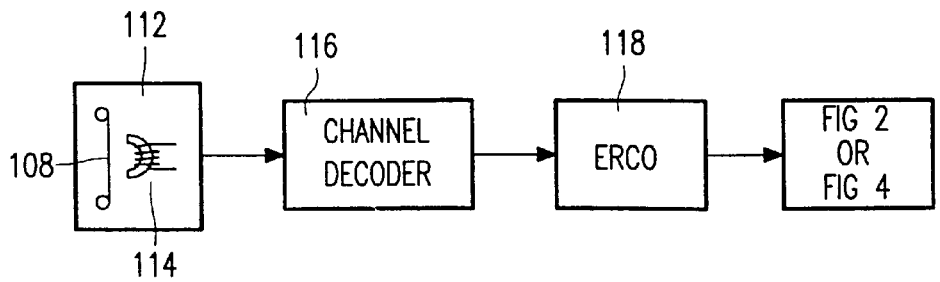
FIG. 6 shows a data expansion apparatus incorporated in a receiver, which is in the form of a reproduction apparatus.

FIG. 6 shows the data expansion apparatus of FIG. 2 or 4 incorporated in a receiver apparatus, which is in the form of a reproduction apparatus. The reproducing apparatus further comprises a read unit 112 for reading the data compressed n-level information signal from a track on the record carrier 108. In the present example, the record carrier 108 is a magnetic record carrier, so that the read unit 112 comprises at least one magnetic head 114 for reading the data compressed n-level information signal from the record carrier 108. The record carrier may however be an optical record carrier, such as a CD disk or a DVD disk.

As has been explained above, transmission via a transmission medium, such as a radio frequency link or a record carrier, generally requires an error correction encoding and a channel encoding carried out on the data compressed n-level information signal to be transmitted, so that a corresponding channel decoding and error correction can be carried out upon reception. FIG. 6 shows the signal processing steps of channel decoding and error correction. carried out on the received signal, received by the reading means 112. The reproducing arrangement of FIG. 6 therefore comprise a channel decoder 116, well known in the art, and an error correction unit 118, also well known in the art, so as to obtain a replica of the data compressed n-level information signal.

Whilst the invention has been described with reference to preferred embodiments thereof, it is to be understood that these are not limitative examples. Thus, various modifications may become apparent to those skilled in the art, without departing from the scope of the invention, as defined by the claims.

Further, the invention lies in each and every novel feature or combination of features.

What is claimed is:

1. A data compressor, comprising:
   an m-level lossless entropy encoder for losslessly entropy encoding a digital input signal having m signal levels into a digital data compressed signal in response to a probability signal, m being a constant integer larger than 2, the m-level input signal depending on a digital information signal having n signal levels, n being a constant integer larger than 2;

an n-level predictor for providing a prediction signal in response to the n-level information signal; and a probability generator for generating the probability signal determined in response to the prediction signal.

2. The data compressor of claim 1 further comprising an n-level analog-to-digital converter for converting an analog input signal into the digital n-level information signal.

3. The data compressor of claim 2 in which the n-level analog-to-digital converter includes an n-level sigma-delta modulator.

4. The data compressor of claim 1 in which n is 3 so that each n-level signal alternatively assumes each of 3 different signal levels to represent information.

5. The data compressor of claim 1 in which the n-level input signal is the n-level information signal.

6. The data compressor of claim 1 further comprising:

a quantizer for quantizing the prediction signal into a predicted version of the digital n-level information signal; and a signal combiner to combine the n-level information signal and the predicted version thereof so as to obtain the m-level input signal.

7. The data compressor of claim 1 in which the n-level predictor is a prediction filter.

8. The data compressor of claim 1 in which the n-level predictor provides a multi-value prediction signal.

9. The data compressor of claim 1 in which the n-level predictor is adaptive.

10. The data compressor of claim 1 in which the probability generator is adaptive.

11. The data compressor of claim 1, in which the entropy encoder is an arithmetic encoder.

12. The data compressor of claim 1, in which m=2n−1.

13. The data compressor of claim 1 in which:

the data compressor further comprises an n-level analog-to-digital converter for converting an analog input signal into the digital n-level formation signal;

the n-level analog-to-digital converter includes an n-level sigma-delta modulator;

n is 3 so that each n-level signal alternatively assumes each of 3 different levels to represent information;

the m-level input signal is provided by apparatus selected from one of: a combiner circuit; and a connection to receive the n-level information signal as the n-level input signal, wherein m=n; the combiner circuit including: a quantizer for quantizing the prediction signal into a predicted version of the n-level information signal; and a signal combiner to combine the n-level information signal and the predicted version thereof so as to provide the m-level input signal, wherein m=2n−1;

the n-level predictor is a prediction filter which provides a multi-value prediction signal;

the n-level predictor is adaptive;

the probability generator is adaptive; and the entropy encoder is an arithmetic encoder.

14. A data compression method comprising the steps of:

n-level input converting an analog signal into a digital information signal having n signal levels, n being a constant integer larger than 2;

m-level lossless entropy encoding a digital input signal having m signal levels into a data compressed signal in response to a probability signal, the m-level input signal depending on the n-level information signal, m being a constant integer larger than 2;

n-level generating a first prediction signal in response to the n-level information signal; and generating the probability signal determined in response to the prediction signal.

15. The data compression method of claim 14 in which:

the n-level input converting includes n-level sigma-delta modulation;

n is 3 so that each n-level signal alternatively assumes each of 3 different levels to represent information;

the m-level input signal is provided by selecting one of the steps of: receiving the n-level information signal as the n-level input signal, wherein m=n; and generating an m-level input signal by the steps of, quantizing the prediction signal into a predicted version of the n-level information signal; and combining the n-level information signal and the predicted version thereof so as to obtain the m-level input signal, and wherein m=2n−1;

the n-level prediction includes prediction filtering to provide a multi-value prediction signal; and the entropy encoding includes arithmetic encoding.

16. A data expander comprising:

an m-level lossless entropy decoder for converting a data compressed signal into a digital output signal having m signal levels in response to a probability signal, m being a constant integer larger than 2;

an n-level predictor for generating a prediction signal in response to a digital information signal having n signal levels, the n-level information signal depending on the m-level output signal, n being a constant integer larger than 2; and a probability generator for generating the probability signal determined in response to the prediction signal.

17. The data expander of claim 16 further comprising an n-level digital-to-analog converter for converting the digital n-level information signal into an analog output signal.

18. The data expander of claim 16 in which n is 3 so that each n-level signal alternatively assumes each of 3 different levels to represent information.

19. The data expander of claim 16 in which the n-level information signal is the m-level output signal, whereby n=m.

20. The data expander of claim 16 further comprising:

a quantizer for quantizing the prediction signal into a predicted version of the m-level output signal; and a signal combiner to combine the m-level output signal and the predicted version thereof so as to obtain the n-level information signal.

21. The data expander of claim 16 in which the n-level predictor is a prediction filter which provides a multi-value prediction signal.

22. The data compressor of claim 16 in which the n-level predictor is adaptive.

23. The data compressor of claim 16 in which the probability generator is adaptive.

24. The data expander of claim 16 in which the entropy encoder is an arithmetic encoder.

25. The data expander of claim 20 in which m=2n−1.

26. The data expander of claim 16 in which:

the data expander further comprises an n-level digital-to-analog converter for converting the digital n-level information signal into an analog output signal;

n is 3 so that each n-level signal alternatively assumes each of 3 different levels to represent information;

the n-level information signal is provided by apparatus selected from one of: a connection to provide the m-level output signal as the n-level information signal, whereby m=n; and combination apparatus including: a quantizer for quantizing the prediction signal into a predicted version of the m-level output signal; and a signal combiner to combine the m-level output signal and the predicted version thereof so as to obtain the n-level information signal;

the n-level predictor is a prediction filter which provides a multi-value prediction signal;

the n-level predictor is adaptive;

the probability generator is adaptive; and the entropy encoder is an arithmetic encoder.

27. A data transmission system, comprising:

an m-level lossless entropy encoder for losslessly entropy encoding a digital m-level input signal into a digital data compressed signal in response to a probability signal, m being a constant integer larger than 2, the m-level input signal depending on a digital information signal having n signal level, n being a constant integer larger than 2;

an n-level predictor for providing a prediction signal in response to the n-level information signal;

a probability generator for generating the probability signal determined in response to the prediction signal; and a transmitter for launching the data compressed information signal into a transmission medium.

28. The transmission system of claim 27 further comprising a error correction encoder for error correction encoding the data compressed signal prior to transmission into the medium.

29. The transmission system of claim 27 further comprising a channel encoder for channel encoding the data compressed signal prior to transmission into the medium.

30. The transmission system of claim 27 in which the medium is selected from: a radio frequency link and an optical record carrier.

31. The transmission system of claim 30 in which the optical record carrier is selected from a CD and a DVD.

32. The transmission system of claim 27 in which:

the data transmission system further comprises an n-level analog-to-digital converter for converting an analog input signal into the digital n-level information signal;

the n-level analog-to-digital converter includes an n-level sigma-delta modulator;

n is 3 so that each n-level signal alternatively assumes each of 3 different levels to represent information;

the m-level input signal is provided by apparatus selected from one of: a combiner circuit; and a connection to receive the n-level information signal as the n-level input signal, wherein n=m; the combiner circuit including: a quantizer for quantizing the prediction signal into a predicted version of the n-level information signal; and a signal combiner to combine the n-level information signal and the predicted version thereof so as to provide the n-level input signal, wherein m=2n−1;

the n-level predictor is a prediction filter which provides a multi-value prediction signal;

the n-level predictor is adaptive;

the probability generator is adaptive;

the entropy encoder is an arithmetic encoder;

the data compressed signal is an n-level signal;

the data transmission system further comprises a error correction encoder for error correction encoding the data compressed signal prior to transmission into the medium;

the data transmission system further comprises a channel encoder for channel encoding the data compressed signal prior to transmission into the medium;

the medium is selected from: a radio frequency link and an optical record carrier; and the optical record carrier is selected from a CD and a DVD.

33. A data reception system comprising:

a receiver for receiving a data compressed signal from a transmission medium;

an m-level lossless entropy decoder for converting the data compressed signal into a digital output signal having m signal levels, in response to a probability signal, m being a constant integer larger than 2;

an n-level predictor for generating a prediction signal in response to a digital information signal having n signal levels, the n-level information signal depending on the m-level output signal, n being a constant integer larger than 2; and a probability generator for generating the probability signal determined in response to the prediction signal.

34. The data reception system of claim 33 in which:

the data reception system further comprises an n-level digital-to-analog converter for converting the digital n-level information signal into an analog output signal;

n is 3 so that each n-level signal alternatively assumes each of 3 different levels to represent information;

the n-level information signal is provided by apparatus selected from one of: a combiner circuit; and a connection to receive the m-level output signal as the n-level information signal, whereby n=m; the combiner circuit including: a quantizer for quantizing the prediction signal into a predicted version of the n-level output signal; and a signal combiner to combine the n-level output signal and the predicted version thereof so as to provide the n-level information signal, wherein m=2n−1;

the n-level predictor is a prediction filter which provides a multi-value prediction signal;

the n-level predictor is adaptive;

the probability generator is adaptive;

the entropy encoder is an arithmetic encoder the data reception system further comprises a error correction decoder for correcting transmission errors in the received data compressed information signal prior to n-level lossless entropy decoding;

the data reception system further comprises a channel decoder for channel decoding the received data compressed information signal prior to n-level lossless entropy decoding;

the medium is selected from: a radio frequency link and an optical record carrier; and the optical record carrier is selected from: a CD and a DVD.

35. A data transmission method comprising the steps of:

n-level input converting an analog signal into an information signal having n signal levels, n being a constant integer larger than 2;

m-level lossless entropy encoding an input signal having m signal levels into a data compressed signal in response to a first probability signal, m being a constant integer larger than 2, the m-level input signal depending on the n-level information signal, n being a constant integer larger than 2;

n-level generating a first prediction signal in response to the n-level information signal;

generating the first probability signal determined in response to the prediction signal;

transmitting the data compressed information signal into a transmission medium;

receiving the data compressed information signal from the transmission medium;

m-level lossless entropy decoding the received data compressed information signal into a digital m-level output signal in response to a second probability signal;

n-level generating a second prediction signal in response to a second digital information signal having n signal levels, the second n-level information signal depending on the n-level output signal; and generating the second probability signal determined in response to the second prediction signal.

36. The data transmission method of claim 35 in which:

the n-level input converting includes n-level sigma-delta modulation;

n is 3 so that each n-level signal alternatively assumes each of 3 different levels to represent information;

the n-level input signal is provided by selecting one of the steps of: receiving the n-level information signal as the n-level input signal; and providing the n-level input signal by the steps of: quantizing the prediction signal into a predicted version of the n-level information signal; and combining the n-level information signal and the predicted version thereof so as to provide the n-level input signal;

the first prediction signal generation includes prediction filtering to provide a multi-value first prediction signal;

the first prediction signal generation and the second prediction signal generation are both adaptive;

the first probability signal generation and the second probability signal generation are both adaptive;

the lossless entropy encoding includes arithmetic encoding;

the data transmission method further comprises error correction encoding the data expressed information signal prior to transmission;

the data transmission method further comprises channel encoding the data compressed information signal prior to transmitting;

the data transmission method further comprises error correction decoding the data compressed information signal after reception so as to correct transmission errors;

the data transmission method further comprises channel decoding the data compressed information signal after reception;

the medium is selected from: a radio frequency link and an optical record carrier; and the optical record carrier is selected from a CD and a DVD;

the second n-level information signal is provided by selecting one of the steps of: receiving the the m-level output signal as the second n-level signal, whereby n=m; and providing the n-level information signal by the steps of: quantizing the prediction signal into a predicted version of the n-level output signal; and combining the n-level output signal and the predicted version thereof so as to obtain the reproduction of the n-level information signal, wherein m=2n−1;

the second prediction signal generation includes prediction filtering to provide a multi-value second prediction signal;

the entropy decoding includes arithmetic decoding; and the data transmission method further comprises n-level output converting the n-level information signal reproduction into an analog output signal.

37. A data compressor, comprising:

m-level encoding means for losslessly entropy encoding a digital input signal having m signal levels into a digital data compressed signal in response to a probability signal, m being a constant integer larger than 2, the m-level input signal depending on a digital information signal having n signal levels, n being a constant integer larger than 2;

n-level prediction means for providing a prediction signal in response to the n-level information signal; and probability means for generating the probability signal determined in response to the prediction signal.

38. A data expander comprising:

m-level decoding means for losslessly entropy decoding a data compressed signal into a digital output signal having m signal levels in response to a probability signal, m being a constant integer larger than 2;

n-level prediction means for generating a prediction signal in response to a digital information signal having n signal levels, the n-level information signal depending on the m-level output signal, n being a constant integer larger than 2; and probability means for generating the probability signal determined in response to the prediction signal.

* * * * *